(12) United States Patent
Boulanger

(10) Patent No.: US 7,368,656 B2
(45) Date of Patent: *May 6, 2008

(54) SOLAR CELL FOR A SOLAR GENERATOR PANEL, A SOLAR GENERATOR PANEL, AND A SPACE VEHICLE

(75) Inventor: Bernard Boulanger, Frejus (FR)

(73) Assignee: Thales, Neuilly-sur-Seine (FR)

( * ) Notice: Subject to any disclaimer, the term of this patent is extended or adjusted under 35 U.S.C. 154(b) by 763 days.

This patent is subject to a terminal disclaimer.

(21) Appl. No.: 10/717,565

(22) Filed: Nov. 21, 2003

(65) Prior Publication Data

US 2004/0163699 A1 Aug. 26, 2004

(30) Foreign Application Priority Data

Nov. 25, 2002 (FR) .................................. 02 14732

(51) Int. Cl.
*H01L 31/00* (2006.01)

(52) U.S. Cl. ...................... 136/246; 136/259; 136/292; 136/245; 136/246

(58) Field of Classification Search ................ 136/251, 136/244, 292, 252, 245, 246, 259
See application file for complete search history.

(56) References Cited

U.S. PATENT DOCUMENTS

| 5,520,747 A | 5/1996 | Marks |
| 6,051,775 A | 4/2000 | Brown |
| 6,118,067 A * | 9/2000 | Lashley et al. ............. 136/245 |
| 6,177,627 B1 | 1/2001 | Murphy et al. |
| 6,188,012 B1 | 2/2001 | Ralph |

FOREIGN PATENT DOCUMENTS

| EP | 0 9786 655 A1 | 2/2000 |
| EP | 1 174 342 A1 | 1/2002 |

OTHER PUBLICATIONS

M. Eskenazi et al, "The cellsaver concentrator for spacecraft solar arrays", 17th European Photovoltaic Solar Energy Conference, Oct. 22-26, 2001, pp. 2292-2295, XP001139938.

* cited by examiner

*Primary Examiner*—Nam Nguyen
*Assistant Examiner*—Thanh-Truc Trinh
(74) *Attorney, Agent, or Firm*—Sughrue Mion, PLLC

(57) ABSTRACT

A solar cell for a solar generator panel (10, 10'). According to the invention, the cell is coupled to a reflector (70, 71, 700) in such a manner that together with the reflector the cell forms an individual component (20, 21, 20'), while the other end (E2, E2') of the reflector remains free, the mechanical flexibility properties of the reflector being determined in such a manner as to enable it, in the absence of any vertical pressure, to stay upright in a first position in which its free end points towards outer space, thereby defining a "upper" first face (701, 711) of the reflector facing outer space, while the "lower" opposite face (702, 712) faces the panel, and in such a manner that in a second position, in response to the application of vertical pressure, it is capable of presenting its upper face facing towards the plane of the panel. The invention is particularly applicable to space vehicles having local-concentration solar panels.

32 Claims, 6 Drawing Sheets

FIG_1
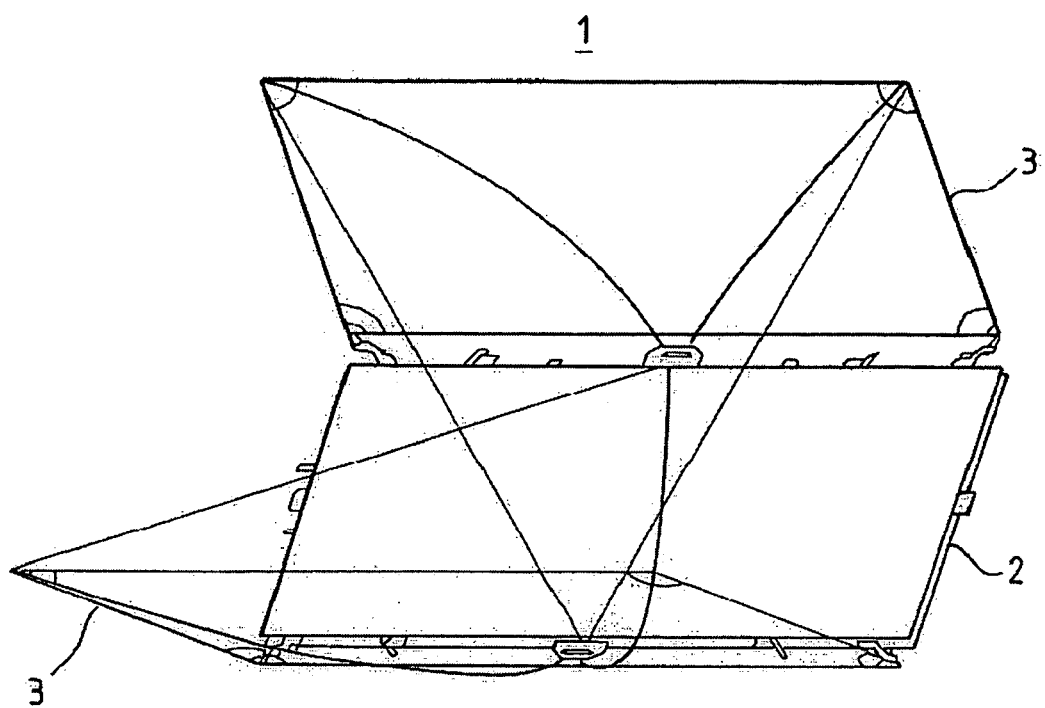
FIG_2a
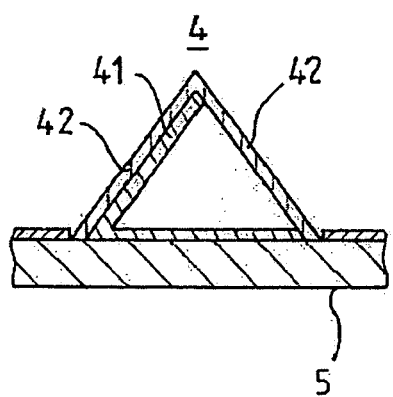
FIG_2b
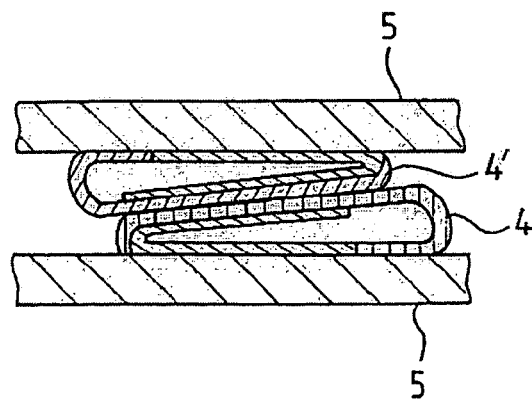

FIG_3
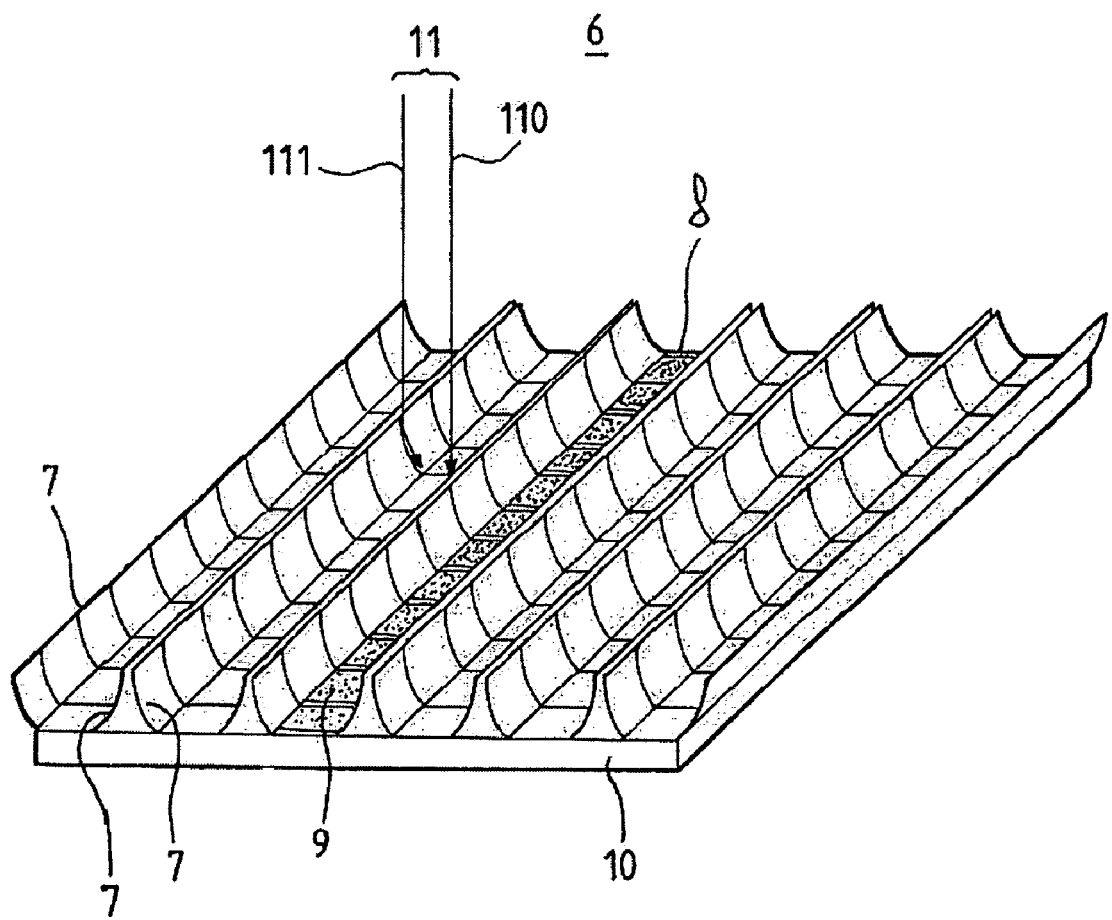

FIG_4a
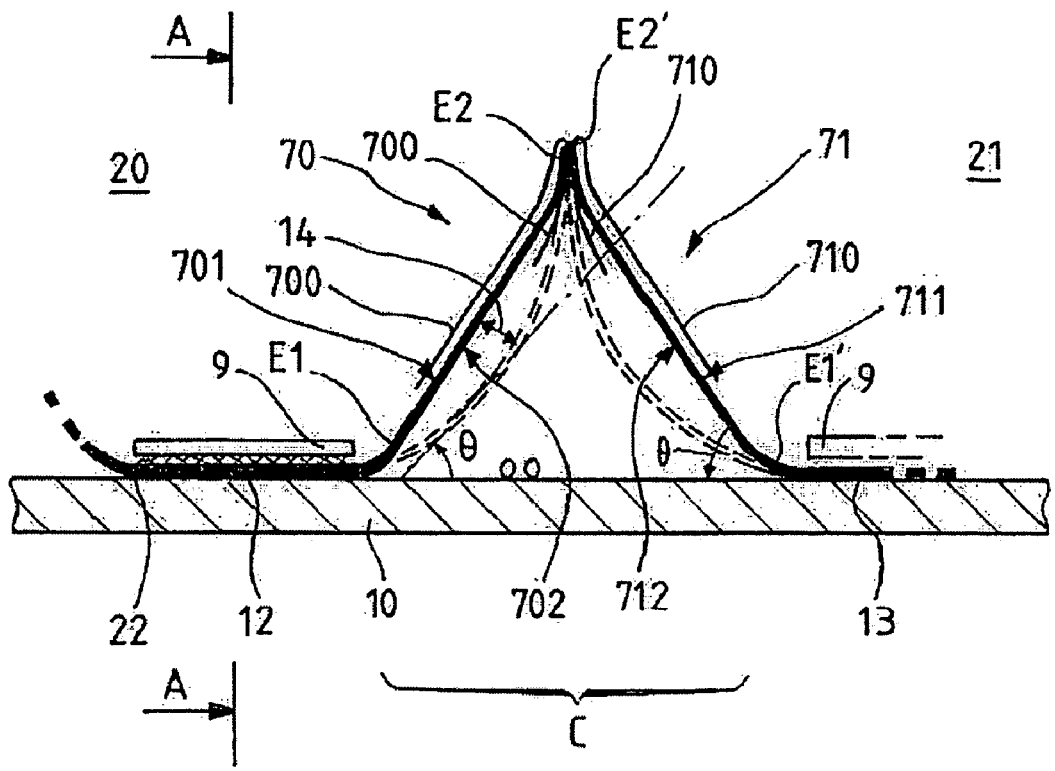
FIG_4b
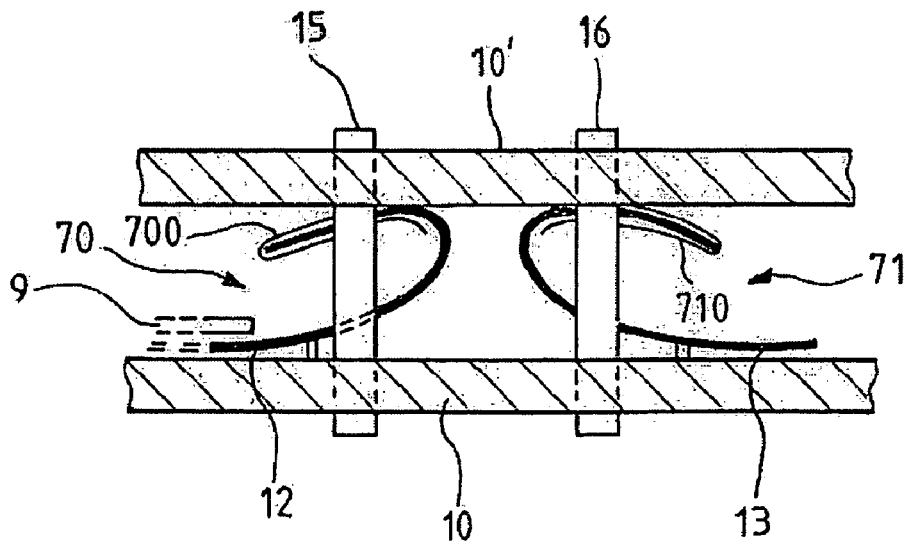

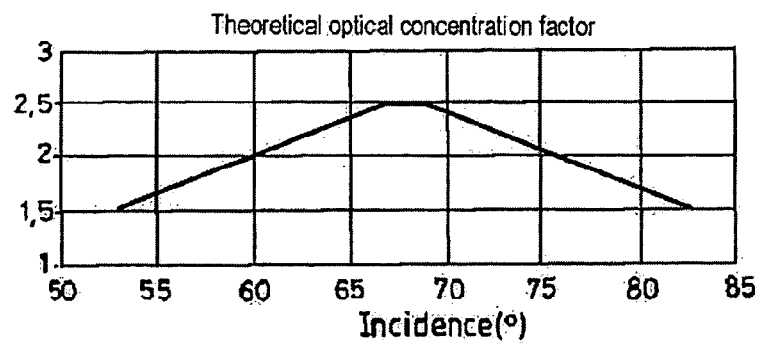
FIG_5a
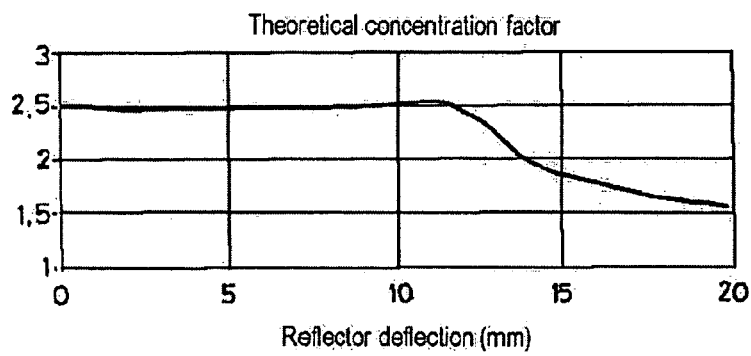
FIG_5b
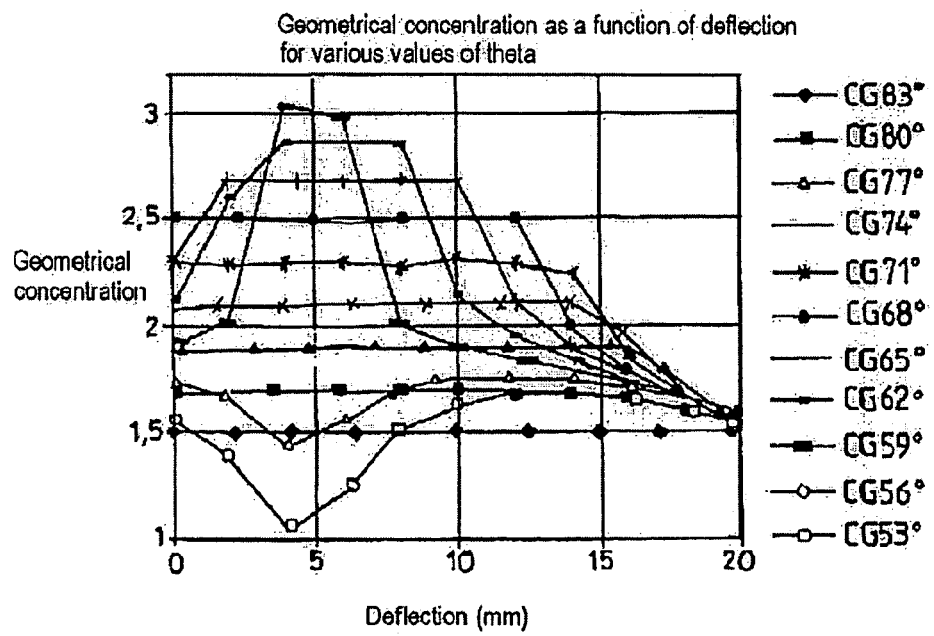
FIG_5c

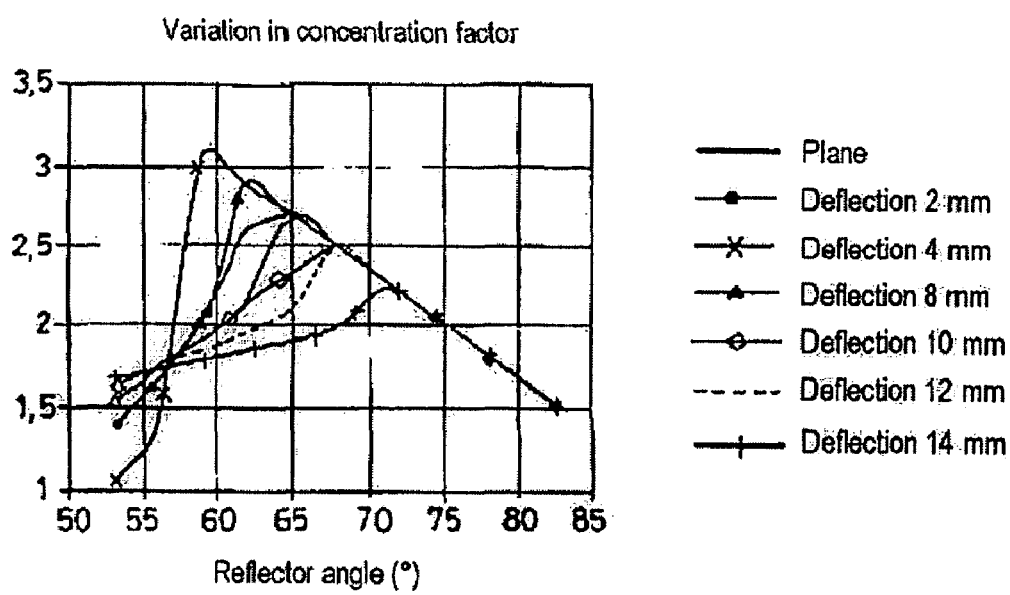
FIG_5d

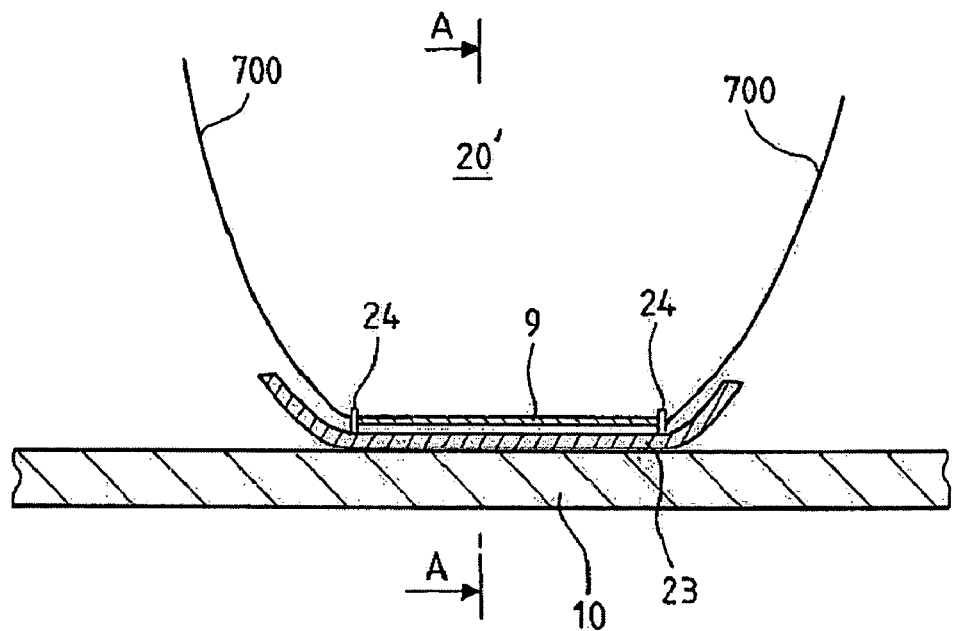
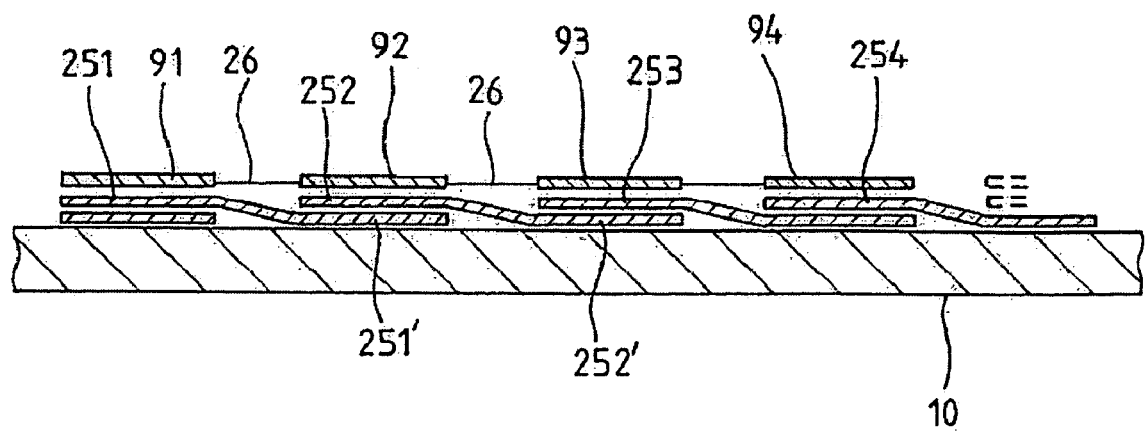

SOLAR CELL FOR A SOLAR GENERATOR PANEL, A SOLAR GENERATOR PANEL, AND A SPACE VEHICLE

In general terms, the present invention relates to the field of solar cells, in particular for space applications. More particularly it relates to a solar cell for a solar generator panel, in particular for a space vehicle, the panel including at least one reflector for reflecting solar radiation onto at least one photovoltaic cell of the panel.

The invention also relates to a solar generator panel and to a space vehicle.

A solar generator panel transported in a space vehicle such as a satellite generally comprises:

- a panel supporting an array of photovoltaic cells forming strings of cells, for transforming solar energy into electrical energy; and
- an array of reflectors for concentrating solar radiation onto the above-mentioned cells by means of a coating having appropriate properties.

Such solar generator panels can be distributed in a very wide variety of configurations. Conventionally, they comprise a longitudinal succession extending parallel to a direction going away from the body of the space vehicle, and around which the generator is designed to turn in order to track the sun. Nevertheless, in order to increase the electrical power available, proposals have been made to provide, in addition to the above panels, additional panels disposed laterally. Configurations are also known in which the panels are disposed in a transverse direction, i.e. in a direction extending transversely to the above-mentioned longitudinal direction along which there extends a yoke which connects the generator to the body of the space vehicle and about which the generator is adapted to turn in order to track the sun.

During launch, the generator is folded and its panels are stacked one on another in a stacked or storage configuration.

Putting the generator into operational service, e.g. when the vehicle is a satellite and has been put on its service orbit, requires the stack of panels to be unfolded: they need to be "deployed".

In order to go from the stacked configuration to the deployed configuration in which the solar panels are disposed substantially in the same plane, the panels are hinged together in pairs either by means of hinges having adjacent elements hinged about a pivot axis and each connected to one of two adjacent panels, or else by means of hinges connecting together parallel panel edges.

Concerning the way in which solar radiation is concentrated, proposals were initially made for a "trough" system 1 as shown in FIG. 1 which was thought to be attractive because of its apparent simplicity of implementation. It consists in deploying a pair of flexible reflectors on either side of a traditional solar panel 2, the reflectors serving geometrically to double the surface area that serves to collect solar flux. However, that system suffers from several drawbacks, and in particular the drawback of the thermal model adopted and above all the drawback of presenting a technological limit in terms of concentration factor and thus in terms of power. In addition, it is difficult to keep the reflecting films in the optimum configuration, with departures from planeness and lack of stiffness being likely to appear. An additional problem lies in that the impact of such defects on the reflectors (holes, folds) leads to its active surface becoming non-uniform, which in turn leads to the appearance of the so-called "hot point" phenomenon: large variations in electric current can arise between one string of cells and another associated with the non-uniformity of the solar flux distribution.

In order to mitigate those various drawbacks, there then appeared a novel concept for concentration. In that concept, a generator panel presented an alternating succession of strings of cells and of reflectors. Concentration then occurs locally at cell level which means that the system is commonly referred to as a "local" concentration system.

That type of local concentration system is described in U.S. Pat. No. 6,177,627, for example, and is illustrated in FIGS. 2a and 2b of the present application. FIG. 2a shows a reflector 4 supported by a panel 5. The reflector 4 is of triangular section, comprising a flexible metal portion 41 covered on its two walls that are open towards space in a flexible metal foil 42 suitable for reflecting solar radiation. In the deployed position as shown in FIG. 2b, the reflector is naturally tensioned, with the portion 41 being made of a material that stands up naturally in the erect position. However, when the panels 5 are in their stacked configuration, as shown in FIG. 2b, facing panels are arranged in such a manner as to minimize the space that exists between them, with the reflectors 4 and 4' being compressed maximally against each other.

However in local concentration systems as described above, a given string of solar cells with its associated reflectors needs to be subjected to a matching stage prior to being put into place on the panel, this stage consisting in sorting cells by photoelectric efficiency so that they have much the same percentage value (in order to ensure that no cell of efficiency significantly lower than that of the others limits the current in the entire string); this sorting stage is performed without the reflectors, such that when the reflectors are put into place they give rise to "dismatching" in the string by an amount that is representative of the dispersion in the concentration coefficients of the reflectors; overall this has the consequence of losing power.

In addition, in the prior art, when a cell breaks down, it is necessary to remove the two reflectors beside the cell in order to replace the cell and it is then necessary to put the two reflectors back into place. That breakdown procedure is expensive in terms of human intervention.

An object of the present invention is thus to remedy the above-described problems by proposing a novel solar cell concept for a solar generator panel, that has at least one reflector, the concept enabling photoelectric efficiency to be optimized during placement of cells on the panel.

To this end, the invention provides a solar cell for placing on a solar generator panel the cell being characterized in that it is coupled to a reflector for reflecting solar radiation onto the cell, the reflector which is designed also to be placed on said panel being of substantially the same width as the contact width of the cell and being fixed at one of its ends in the height direction to the cell by fixing means so that together the cell and the reflector form an individual component, whereas the other end of the reflector remains free, the mechanical flexibility properties of the reflector being determined in such a manner as to enable it to keep upright in a first position with its free end pointing towards outer space in the absence of vertical pressure being applied thereto, thereby defining a "top" first face of the reflector facing out to space, while the "lower" opposite face faces the panel, and in such a manner, in a second position, as to be capable of presenting its upper face facing towards the plane of the panel in response to the application of vertical pressure.

Thus, because of the invention, the matching step needs to be performed only once the reflector has been assembled with the cell. That is why reflector dispersion does not penalize cell efficiency, unlike in the prior art.

In addition, another advantage of the invention lies in simplifying replacement of the parts in the event of a cell breaking down. Under such circumstances, it suffices to remove the individual defective component and to replace it with a new component. This advantage is considerable when compared with the need to withdraw two rows of reflectors and to replace them for the slightest breakdown. In addition, the functional reflecting surface of the reflector, i.e. its top face, which is folded over onto itself in the stacked configuration, is completely protected against any degradation due to external action such as rubbing against facing surfaces. Furthermore, another considerable advantage of the invention lies in the accessibility of the space under the flexible reflecting blade of the reflector, should it be necessary to repair the cabling that occupies this space. Once the solar cells and the reflectors of the panel have been stored, the cabling under the roof of the reflectors is also in place and a series of tests is implemented in order to verify the operation of each of the elements of the panel. In the event of one of the cables operating in defective manner, it is unavoidable with prior art local concentration reflectors of the kind described in U.S. Pat. No. 6,177,627, to remove the entire reflector in order to access the associated cabling. By means of the invention, it is no longer necessary to remove the reflector. It suffices to move the flexible reflector out of the way in order to achieve the desired accessibility.

In an embodiment of the invention, the cell rests on the central portion of the reflector, the ends thereof being shaped in such a manner as to form two lateral under-reflectors for the cell.

In an embodiment of the invention, the reflector is made of an electrically insulating material, e.g. Kapton™, and of mechanical reinforcement to make said flexibility possible, e.g. reinforcement made of titanium.

In an embodiment of the invention, both under-reflectors are fixed by electrically insulating fasteners to the cell, the cell resting on an electrically insulating support shaped in such a manner as to support the base of each under-reflector when the under-reflectors are deployed.

In an embodiment of the invention, the under-reflectors are made of a reflecting film.

In an embodiment of the invention, said reflector includes a base on which the cell rests, said base and the two under-reflectors forming a single piece of electrically insulating material, the top ends of the under-reflectors being provided with a reflecting film.

In an embodiment of the invention, in a section in the long direction of a string of cells to which the cell belongs, an electrically insulating support of a cell referred to as the "present" cell is shaped to have a profile with two oppositely-directed bends so that a lower first end of the support can support a higher end of a support associated with a first cell adjacent to the present cell and belonging to said string, and the higher second end for supporting the present cell can rest on a lower end of a support associated with a second cell adjacent to said present cell and belonging to said string, this arrangement between adjacent supports enabling the cells in a given string to be fully electrically insulated from the panel supporting the string.

In an embodiment of the invention, said flexible reflector presents mechanical properties such that at equilibrium in the first position, said upper face is concave.

In an embodiment of the invention, said flexible material presents mechanical properties such that at equilibrium in the first position, each reflector forms a plane with the exception of its free end which is outwardly curved so as to enable it to come into contact during the stage of releasing vertical pressure.

In an embodiment of the invention, the surfaces of the lower faces present a coefficient of friction that is low.

In an embodiment of the invention, the two upper faces in each pair of under-reflectors associated with the same cell are folded over onto themselves so as to face each other in the second position.

The invention also provides a solar generator panel characterized in that it includes a solar cell of the invention.

The invention also provides a space vehicle, in particular a satellite, characterized in that it includes a solar generator panel of the invention.

Other characteristics and advantages of the invention appear more clearly on reading the following description of particular embodiments given with reference to the following figures:

FIG. 1, described above, shows a solar panel system with associated reflectors in a first prior art concept;

FIGS. 2a and 2b, described above, show reflectors in a second prior art concept;

FIG. 3 is a diagrammatic perspective view of a solar generator constituting a first embodiment of the invention;

FIG. 4a is a cross-section view of the FIG. 3 panel in the deployed configuration, this view being limited to a pair of facing reflectors, while FIG. 4b shows the same section as FIG. 4a but in a stacked configuration;

FIG. 5a shows how the concentration factor varies as a function of the angle of incidence for a given configuration;

FIG. 5b shows the impact of the concave shape of the reflectors on the optical concentration factor $C_{opt}$;

FIG. 5c shows the combined effects of the concave shape and of the angle of incidence of the reflectors on the optical concentration factor $C_{opt}$;

FIG. 5d shows the sensitivity of the optical concentration factor $C_{opt}$ as a function of the angle of incidence, which is itself associated with the concave shape;

FIG. 6 is a cross-section view showing another embodiment of a cell and a pair of reflectors in accordance with the invention; and FIG. 7 shows a variant that is equally applicable to either of the embodiments of FIGS. 4a and 6, providing means for solving the problem of total insulation between the cells and the panel.

In the following figures, elements performing identical functions are given the same references.

FIG. 3 is a perspective diagram of a solar generator panel 6 constituting an embodiment of the invention.

On its face for facing towards the light source, this panel 6 presents an alternating succession of reflector components 7 and of strings 8 of photovoltaic cells 9 (the cells 9 being shown shaded in the string 8). It should be observed that in this embodiment of the reflectors, they are selected to have a configuration that is slightly concave. As explained below, it is possible to envisage reflectors of other shapes. The reflectors and the cells are supported by a support panel 10.

In FIG. 3, solar flux 11 is represented by arrows, with some light beams 110 illuminating a cell 9 directly while others 111 reach the cell after reflection on a reflector 7.

In addition, it can be observed in FIG. 3 that the cells and the reflectors are arranged in the long direction of the panel (i.e. parallel to a direction going away from the body of the satellite), in order to avoid being affected by seasonal variation in the angle of incidence of solar flux.

FIG. 4a is a cross-section of the FIG. 3 panel in the deployed position, this view being restricted to a pair C of reflectors 70, 71, whereas FIG. 4b shows the same pair as FIG. 4a but in the stacked configuration.

Each reflector 70, 71 is made up of two lateral under-reflectors 70, 71 made of a material that is electrically insulating and flexible. By way of example, each under-reflector may be a Kapton™ film, comprising two thicknesses of 25 micrometers (μm) giving a total thickness of 50 μm between cells and the substrate of the support panel 10. In addition, the Kapton™ includes mechanical reinforcement for shaping it while it is being deployed, e.g. 25 μm of titanium. Naturally, any other material satisfying the desired conditions of flexibility and of erectility (specifically the tendency to stand up in the absence of opposing pressure) can be envisaged. The Kapton™ is covered on the top faces of the under-reflectors 70, 71 by respective optically-reflecting films 700, 710 of the silver type, in turn covered in a protective coating (not shown). This characteristic of the under-reflectors enables them to reflect incident solar rays towards the facing cell 9. As shown, the film 700, 710 extends beyond the free ends E2, E2' and covers a fraction of their bottom faces to enable them to be held securely to the under-reflectors.

Starting from a stacked configuration as described below and after the panels have been released, the deployed configuration of the panels as shown in FIG. 4a enables the reflectors to stand up naturally into their non-stressed position. As shown, the two under-reflectors associated with the cell with which they co-operate face each other. Each under-reflector 70, 71 is extended at its base E1, E1' by a respective support base 12, 13 on which the respective associated cell 9 rests. The cell is fixed to the support base by means of an insulating adhesive 22. Thus, the pair of under-reflectors coupled via their common base and associated with their own cell constitutes an individual component, such as the components referenced 20 or 21. The free ends E2, E2' of the under-reflectors 70, 71 come naturally into contact with each other, exerting the same pressure against each other when in an equilibrium position.

It should be observed that the end E2, E2' may present a small amount of outward curvature so as to enable the two under-reflectors 70, 71 to come into contact appropriately during the stage in which the vertical pressure is released.

In an advantageous variant of the invention, shown in dashed lines in FIG. 4a, the flexible material used for the under-reflector presents mechanical properties such that in the equilibrium position in which the facing under-reflectors rest against each other, the top faces 701 and 711 of the under-reflectors are somewhat concave. The advantage of such a disposition is described below.

As mentioned above, it is emphasized that the advantage that results from the local concentration configuration lies in reducing the effects of reflector distortion on the power delivered to the solar panel. This leads to a better overall concentration factor.

In the present invention, the concentration factor $C_{geom}$ is a function of the angle of inclination θ of the reflectors relative to the plane of the support panel, with this being given by the relationship:

$$C_{geom}=1+2\sin(2\theta-90°)$$

The theoretical limit for this factor is $C_{geom}=3$.

In practice, when the reflectors are of length 2 L relative to a cell of dimension L, as shown in FIG. 4a, the theoretical optical factor obtained by the ray-tracing method reaches an optimum of 2.5 for an angle of incidence corresponding to θ=68°, as can be seen in FIG. 5a which shows the theoretical optical concentration factor as a function of the angle of incidence θ. This assumes that the efficiency in reflection of the reflectors is R=1 and that the reflectors are accurately plane. FIG. 5b shows the effect of the presence of curvature or concavity, as represented by double-headed arrow 14 (FIG. 4a) when applied to a wall of an under-reflector 70, 71. The size of such a deflection arrow corresponds to the distance between the reflector being plane and the point of the under-reflector's curvature that is furthest away from that plane. A deflection of more than 10 mm contributes to a sudden drop in the optical concentration factor.

Any amount of concavity in the reflectors gives rise to variation in the angles of incidence of the under-reflectors. In the initial practical case of $C_{opt}=2.5$, FIG. 5c shows the variation in the concentration factor for different amounts of deflection and consequently for different angles of incidence. It can be seen that the optimum is situated in the vicinity of deflection of about 4 millimeters (mm) ($C_{opt}>3$ and greater than the initial concentration factor of 2.5). When the inclination of the under-reflectors decreases, the surface area of these under-reflectors as seen by the sun increases and the potential energy received increases. With plane under-reflectors, this energy is not reflected onto the cell, but when the under-reflectors are curved, this energy can be reflected onto the cell, thereby increasing the concentration factor.

For a deflection of 4 mm, $C_{opt}$ can be greater than the initial $C_{opt}$ but it then becomes very sensitive to the angle of incidence θ, as shown in FIG. 5d.

The optical concentration factor depends on the optical efficiency R of the material constituting the reflecting film, i.e.: $C_{opt}=1+R(C_{opt(R=1)}-1)$. For example, if R=1, $C_{opt}=2.5$ and if R=0.88, $C_{opt}=2.32$.

Typically, in order to have an optical concentration factor that is stable to within 10%, the angle of incidence must be stable to within ±4°, and the deflection must be less than 12 mm.

It should be emphasized that both for the embodiment shown in FIG. 4a and for its variant shown in dashed lines, the under-surfaces 702, 712 may present a coefficient of friction Φ such that tan Φ<0.25, by way of example with titanium. With such a disposition, when the panels are released, if two under-reflectors are in an asymmetrical position, the friction-free plane portions of the under-surfaces will automatically lead to movement adjusting the positions of the under-reflectors towards an equilibrium position in which symmetry is achieved.

FIG. 4b shows the same section as FIG. 4a but with the panels 10, 10' in the stacked configuration.

The astute concept of the invention is also particularly advantageous in the position adopted by the under-reflectors when the panels are in the stacked configuration. On the ground, the top surfaces 701, 711 of the under-reflectors are folded over and in opposite directions under pressure from the top panel 10'. The panels 10 and 10' are held pressed against each other by clamping strips 15, 16.

Held in this way on the ground until they are released, the reflecting films 700, 710 deposited on the top surfaces 701, 711 of the under-reflectors never come into contact with the top panel 10' or with any other element of the panel. This position protects the reflecting film from being degraded by friction.

With the reflectors folded over, the strips 15, 16 are designed to be released subsequently on the ground. The release means are not described in the present application since they are known in themselves. It often happens that sequences of panel deployment followed by panel refolding occur on several occasions, particularly when several tests are necessary. It will be understood that this increases the risk of contacting reflecting surfaces being damaged, and consequently the invention of the present application provides a major improvement in this respect over the prior art.

FIG. 6 shows another embodiment of the individual cell-reflector component 20' in cross-section through the component.

Unlike the mode described above in which the function of providing electrical insulation between the cell and the panel 10 is integrated in the reflector itself, in the present embodiment, this insulation function is decoupled from the light reflection function and from the photoelectric conversion function. The individual component 20' includes a support 23 of electrically insulating material of the Kapton™ type. This support 23 carries the cell 9 which is stuck to the support 23 by adhesive 22. Lateral under-reflectors 700 are secured by electrically insulating fasteners 24 to the cell 9. The support 23 is also shaped at its edges so that they rise in a concave manner so as to provide support for the bottom ends of the under-reflectors when they are deployed.

In a variant, the support 23 may be removed from the individual component 20'. This amounts to saying that the support 23 constitutes a part of the panel and that removing a component 20' in order to replace it or repair it does not involve the support. Only the cell and the associated reflectors need to be removed.

FIG. 7 shows a variant which is applicable equally well to the embodiment of FIG. 4a and the embodiment of FIG. 6, providing either embodiment with means enabling the problem of total insulation between the cells and the panel to be solved.

FIG. 7 shows a succession of cells 91-94 in the same string 8. Each cell rests on a respective film 251-254 of the Kapton™ type. In the spirit of the present scheme, each film 251-254 includes a tab such as the tabs referenced 251', 252' shaped into a profile having two oppositely-directed bends such that a lowered first end of each tab supports the raised film associated with the adjacent cell, each raised film resting on a lower tab of a film associated with the other cell that is adjacent in the string. By means of this arrangement between films it is possible to achieve complete electrical insulation between the cells and the panel supporting them.

Naturally, electrical connections (often referred to as interconnectors) connecting each cell to its neighbors are represented diagrammatically under reference 26.

Naturally, the description of FIG. 7 is deliberately restricted to only those elements that are needed for understanding it in outline. The way in which the films 251-254 are implemented needs to be adapted as a function of the corresponding embodiment. Thus, for the embodiment of FIG. 4a, the film is placed between the cell 9 and the support base 12, and the associated tab in the lower position is placed beneath the support base 12 of the adjacent cell. In the embodiment of FIG. 6, the film is placed between the cell 9 and the support 23 and the associated tab is placed beneath the support 23 of the adjacent cell.

It should be observed that the film 700, 710 (aluminum or silver or other deposited material that is optically highly reflective in the visible range and that is electrically conductive) is adapted to present a property of being absorbent in the infrared frequency range so as to absorb in the form of infrared radiation the heat stored as a result of receiving solar radiation, while being adapted to offer the property of optical reflection in the frequency range corresponding to visible light.

Naturally, the invention is not limited to the embodiments described in the present application.

The invention claimed is:

1. A solar cell for placing on a solar generator panel, the cell being characterized in that it is coupled to at least one reflector for reflecting solar radiation onto the cell, the reflector which is designed also to be placed on said panel being of substantially the same width as the contact width of the cell and being fixed at one of its ends in the height direction to the cell by fixing means so that together the cell and the reflector form an individual component, whereas the other end of the reflector remains free, the mechanical flexibility properties of the reflector being determined in such a manner as to enable it to keep upright in a first position with its free end pointing towards outer space in the absence of vertical pressure being applied thereto, thereby defining an "upper" face of the reflector facing out to space and a "lower" opposite face facing the panel, and in such a manner, in a second position, as to be capable of presenting its upper face facing towards the plane of the panel in response to the application of vertical pressure.

2. The cell according to claim 1, characterized in that the cell rests on a central portion of the reflector, the ends thereof being shaped in such a manner as to form two lateral under-reflectors for the cell.

3. The cell according to claim 2, characterized in that the reflector is made of an electrically insulating material, and of mechanical reinforcement to make said flexibility possible.

4. The cell according to claim 2, wherein both under-reflectors are fixed by electrically insulating fasteners to the cell, the cell resting on an electrically insulating support shaped in such a manner as to support a base of each under-reflector when the under-reflectors are deployed.

5. The cell according to claim 4, characterized in that the under-reflectors are made of a reflecting film.

6. The cell according to claim 2, characterized in that said reflector includes a base on which the cell rests, said base and the two under-reflectors forming a single piece of electrically insulating material, the top ends of the under-reflectors being provided with a reflecting film.

7. The cell according to claim 1, wherein each cell is an individual cell in a string of cells, and an electrically insulating support is located between the individual cell and the panel, wherein the electrically insulating support is shaped to have a profile with two oppositely-directed ends so that a lower first end of the support can support a higher second end of an electrically insulating support associated with a first cell adjacent to the individual cell and belonging to said string of cells, and the higher second end of the electrically insulating support of the individual cell can rest on a lower first end of an electrically insulating support associated with a second cell adjacent to said individual cell and belonging to said string of cells, whereby the each cell in the string of cells is electrically insulated from the panel supporting the string of cells.

8. The cell according to claim 1, characterized in that said reflector presents mechanical properties such that at equilibrium in the first position, said upper face is concave.

9. The cell according to claim 1, wherein the at least one reflector presents mechanical properties such that at equilibrium in the first position, each reflector forms a plane with the exception of its free end which is outwardly curved so as to enable it to come into contact with a free end of a reflector of a cell in an adjacent cell string during the stage of releasing vertical pressure.

10. The cell according to claim 1, wherein the reflector is a first reflector, and wherein the first reflector contacts a second reflector of an adjacent cell, the second reflector having a lower face which abuts the lower face of the first reflector in a symmetrical position when in equilibrium, and wherein the coefficient of friction between contacting portions of the lower face of the first reflector and the lower face of the second reflector is such that when the reflectors are asymmetrically positioned with respect to each other, the coefficient of friction does not prevent repositioning of the reflectors to the symmetrical position.

11. The cell according to claim 2, characterized in that the two upper faces in the two under-reflectors associated with the same cell are folded over onto themselves so as to face each other in the second position.

12. The cell according to claim 1, wherein the upper face of the reflector is folded over onto itself in the second position.

13. The cell according to claim 4, wherein the cell is attached to the electrically insulating support by means of an insulating adhesive.

14. The cell according to claim 3, wherein the insulating material is Kapton™ and the mechanical reinforcement is made of titanium.

15. The cell according to claim 4, wherein the under-reflectors are covered at least in part by a reflecting film.

16. A solar generator panel, characterized in that it includes a solar cell according to claim 1.

17. A spacecraft, characterized in that it includes a solar generator panel according to claim 16.

18. The spacecraft according to claim 17, wherein the spacecraft is a satellite.

19. A solar generator panel, comprising:
a first solar cell component comprising:
a solar cell;
a first reflector to reflect solar radiation onto the cell, wherein the first reflector comprises an upper face, a lower face, a first end and a second end; and
wherein the first end is attached to and extended by a support base, the support base being disposed on the solar generator panel, the second end is free and the solar cell is fixed to the support base, whereby the support base is disposed between the solar cell and the solar generator panel; and
wherein in a first position, in the absence of a vertical force applied to the first reflector in a direction generally towards the solar generator panel, the upper face faces away from the solar generator panel and the lower face faces towards the solar generator panel, and in a second position, in the presence of the vertical force applied to the first reflector in the direction generally towards the solar generator panel, at least a portion of the upper face faces the solar generator panel.

20. The solar generator panel according to claim 19, wherein the first reflector is flexible so as to flex from the first position to the second position in response to the vertical force.

21. The solar generator panel according to claim 19, wherein the first end extends underneath the solar cell.

22. The solar generator panel according to claim 19, wherein the upper face comprises a reflective surface that reflects solar radiation.

23. The solar generator panel according to claim 19, wherein the reflector is substantially the same width as the width of the solar cell.

24. The solar generator panel according to claim 19, wherein the first solar cell component further comprises:
a second reflector integral to and extending from the support base of the first reflector, wherein the second reflector faces the first reflector and is symmetrically aligned with the first reflector.

25. The solar generator panel according to claim 19, wherein the support base is made of insulating material.

26. The solar generator panel according to claim 19, further comprising a plurality of solar cell components arranged in parallel rows on the solar generator panel.

27. The solar generator panel according to claim 26, wherein the support base of the first solar cell component comprises a lower first end and a higher second end, wherein adjacent support bases of the plurality of solar cell components partially overlay.

28. The solar generator panel according to claim 26, wherein the first solar cell component is removable as a unit from the solar generator panel, without removal of an adjacent solar cell component.

29. A solar generator panel, comprising:
a first solar cell component, comprising:
a support base disposed on the solar generator panel;
a solar cell disposed on the support base;
a first reflector to reflect solar radiation onto the cell, disposed on the support base, wherein the first reflector comprises an upper face, a lower face, a first end and a second end; and
wherein the first end is attached to the solar cell, the second end is free and whereby the support base is disposed between the solar cell and the solar generator panel; and
wherein in a first position, in the absence of a vertical force applied to the first reflector in a direction generally towards the solar generator panel, the upper face faces away from the solar generator panel and the lower face faces towards the solar generator panel, and in a second position, in the presence of the vertical force applied to the first reflector in the direction generally towards the solar generator panel, at least a portion of the upper face faces the solar generator panel.

30. The solar generator panel according to claim 29, further comprising a plurality of solar cell components arranged in parallel rows on the solar generator panel.

31. The solar generator panel according to claim 30, wherein the first solar cell component is removable as a unit from the solar generator panel, without removal of an adjacent solar cell component.

32. The solar generator panel according to claim 30, wherein the solar cell and the attached reflector are removable as a unit from the solar generator panel, without removal of an adjacent solar cell component.

* * * * *